United States Patent
Wu

(10) Patent No.: US 6,211,002 B1
(45) Date of Patent: *Apr. 3, 2001

(54) CMOS PROCESS FOR FORMING PLANARIZED TWIN WELLS

(75) Inventor: Shye-Lin Wu, Hsinchu (TW)

(73) Assignee: Texas Instruments-Acer Incorporated, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/292,478

(22) Filed: Apr. 15, 1999

Related U.S. Application Data

(63) Continuation-in-part of application No. 09/014,865, filed on Jan. 28, 1998, now Pat. No. 5,963,802.

(51) Int. Cl.[7] .............................................. H01L 21/8238
(52) U.S. Cl. ....................... 438/223; 438/221; 438/224; 438/296; 438/424
(58) Field of Search .................................. 438/424, 427, 438/435, 218, 221, 223, 224, 296

(56) References Cited

U.S. PATENT DOCUMENTS

| | | | |
|---|---|---|---|
| 5,256,593 | * | 10/1993 | Iwai . |
| 5,445,989 | * | 8/1995 | Lur et al. . |
| 5,516,721 | * | 5/1996 | Galli et al. . |
| 5,565,376 | * | 10/1996 | Lur et al. . |
| 5,849,625 | * | 12/1998 | Hsue ................................ 438/424 |
| 5,963,802 | * | 10/1999 | Wu ................................... 438/228 |
| 5,994,178 | * | 11/1999 | Wu ................................... 438/221 |

* cited by examiner

Primary Examiner—Trung Dang

(57) ABSTRACT

This invention proposes a process to form planarized twin-wells for CMOS devices. After depositing pad oxide and a silicon nitride layers, a high-energy phosphorus ion implantation is performed to form the N-well by using a photoresist as a mask. A thick oxide layer deposited by liquid phase deposition process is then grown on the N-well region part of the silicon nitride layer, but not on the photoresist. After stripping the photoresist, a high-energy boron ion implantation is carried out to form the P-well by using the LPD-oxide layer as a mask. The thick LPD-oxide layer is removed by BOE or HF solution. Trenched isolation regions are formed to isolate and define active regions. After removing the pad oxide and the silicon nitride layer, the CMOS device is fabricated by standard processes.

20 Claims, 4 Drawing Sheets

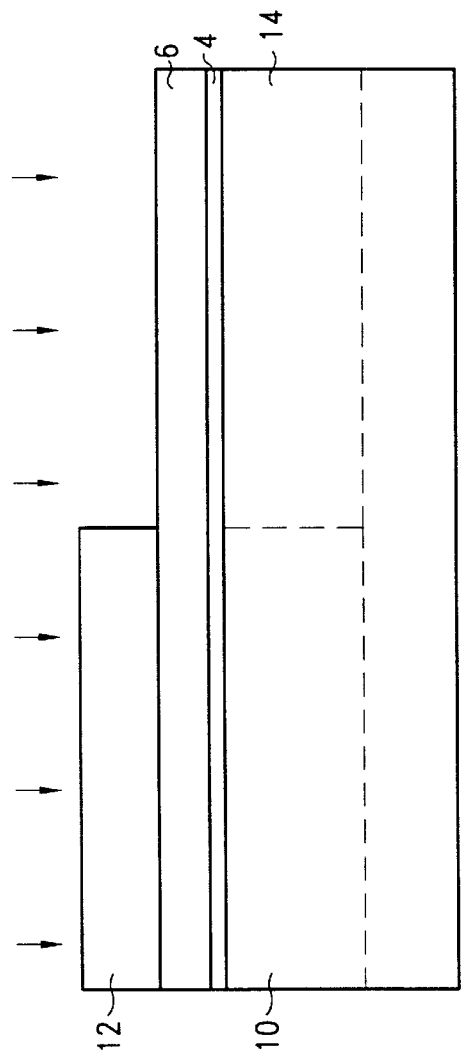
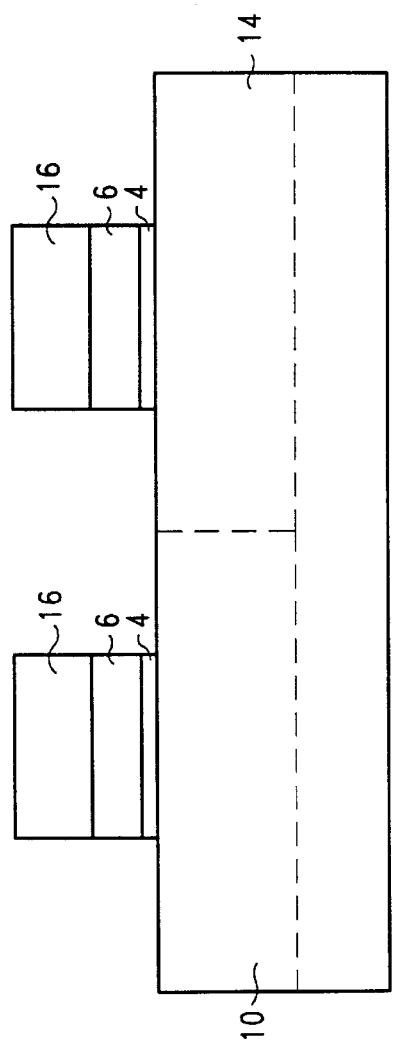

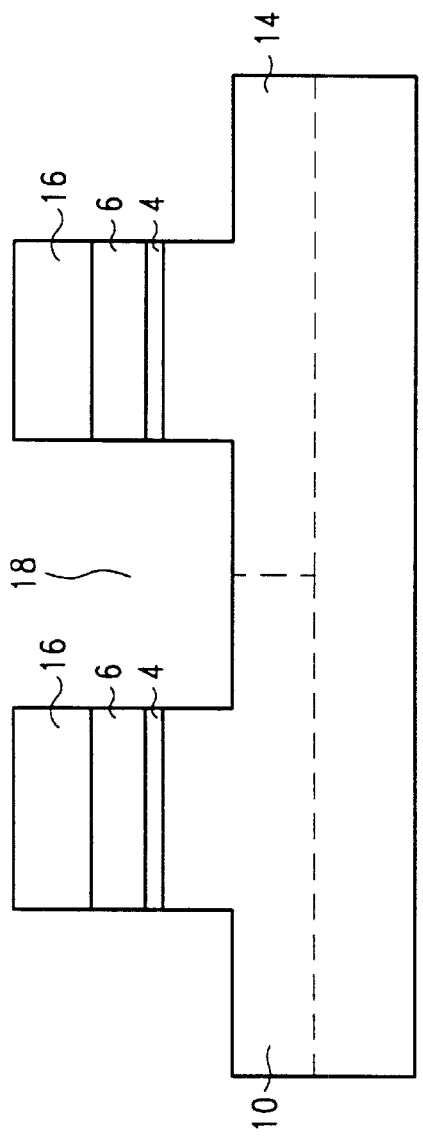
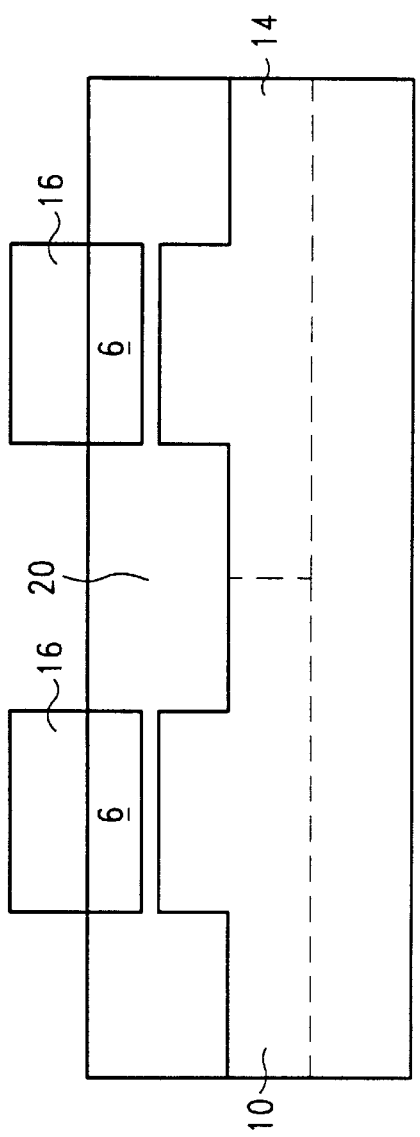

CMOS PROCESS FOR FORMING PLANARIZED TWIN WELLS

CROSS REFERENCE TO RELATED APPLICATIONS

This invention is a continuation-in-part application Ser. No. 09/014,865 filed on Jan. 28, 1998 now U.S. Pat. No. 5,963,802 titled "CMOS PROCESS FOR FORMING PLANARIZED TWIN WELLS", and assigned to the same assignee with the same inventor as the present application.

FIELD OF THE INVENTION

The present invention relates to a method for forming twin-wells for a complementary mental oxide semiconductor (CMOS) device, and particularly to a process for forming planarized twin-wells structure.

BACKGROUND OF THE INVENTION

The metal oxide semiconductor (MOS) transistor, including N-channel MOS (NMOS), P-channel MOS (PMOS) and complementary MOS (CMOS), is one of the most important devices in integrated circuit technology today. And, because of the high loss of energy and the high generation of heat, the stability and the reliability of NMOS and PMOS are poor. They are gradually replaced by CMOS when the integration of the semiconductor device becomes higher and higher.

There are three types of CMOS devices: P-well type, N-well type and twin-wells type. The CMOS devices of P-well type are fabricated by forming N-channel devices in P-wells, while the P-channel devices are formed in the N-type substrate outside the P-wells. Contrarily, the CMOS devices of N-well type are fabricated by forming P-channel devices in N-wells, while the N-channel devices are formed in the P-type substrate outside the N-wells. The devices with twin-wells structure are fabricated with both types of wells built in either type substrate independently, while there is one MOS devices of opposite type formed in each well respectively.

The selection of the well types described above depends mostly on the circuit application. For example, the N-well technique is often used for fabricating dynamic random access memories (DRAMs) because P-channel devices have low substrate current whereas the high substrate current can be easily sunk from the P-type substrate. And the P-well technique has a benefit in its simpler fabrication because the P-well devices are less sensitive to field inversion and then the P-well itself can be used to be the channel stop for N-channel. The twin-wells structure, wherein the doping profiles in each well could be set independently to optimize both device types, is suitable to be used in the high integration circuit of sub-micron devices. In addition, the twin-wells structure has lower junction capacitance and lower body effect, and it has the flexibility of selecting substrate type without affecting performance. These advantages make the twin-wells a better structure than the N-well and the P-well structure.

Recently, there are three methods provided for fabricating the twin-wells structure These are disclosed in the following references Ruojia Lee, et al. in U. S. Pat. No. 5,024,961 titled "Blanket Punchthrough and Field-isolation Implant for Sub-micron N-channel CMOS Devices", Douglas C. H. Yu, et al. in "Low Threshold Voltage CMOS Devices with Smooth Topography for 1 Volt Application" IEDM Tech. Dig., Vol. 94, p. 489, (1994); and C. T. Liu, et al. in "0.2-$\mu$m n-Channel and p-Channel MOSFET's Integrated on Oxidation-Planarized Twin-Tubs" IEEE Electron Device Letter, Vol. 17, p. 500 (1996). But all of these three methods will also have poor topographies, that is, a nonplanar surface occurs at or near the interface of the P and the N-well due to the high temperature oxidation used over one well. Although a height difference is useful for subsequent lithography for fabricating these devices, a large difference makes the transitional area between the P-well and N-well wasteful. Therefore, there is a need for a simplified and an improved method for fabricating CMOS devices with twin-wells structure.

SUMMARY OF THE INVENTION

A process for forming twin-wells devices with smooth surface topography is disclosed. After depositing pad oxide and a silicon nitride layers, a photoresist is patterned on the silicon nitride layers to define the N-well region. Next, a high-energy phosphorus ion implantation is performed to form the N-well by using the patterned photoresist as a mask. A thick oxide layer deposited by liquid phase deposition process is then grown on the N-well region part of the silicon nitride layer, but not on the photoresist. After stripping the photoresist, a high-energy boron ion implantation is carried out to form the P-well by using the LPD-oxide layer as a mask. The thick LPD-oxide layer is removed by BOE or HF solution. Trenched isolation regions are formed to isolate and define active regions. The dopants are activated and driven in to form twin-wells at this step. After removing the pad oxide and the silicon nitride layer, the CMOS device is fabricated by standard processes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 is a cross-sectional view of a semiconductor wafer illustrating the step of removing the photoresist and then performing a high-energy boron ion implantation to form the P-well on the substrate according to the present invention;

FIG. 4 is a cross-sectional view of a semiconductor wafer illustrating the step of removing the LPD-oxide layer and etching the pad oxide layer and silicon nitride layer using a photoresist as a mask to form the pattern of active region on the substrate according to the present invention;

FIG. 5 is a cross-sectional view of a semiconductor wafer illustrating the step of forming trenched regions in the substrate according to the present invention;

FIG. 6 is a cross-sectional view of a semiconductor wafer illustrating the step of depositing a LPD-oxide in the trenched regions according to the present invention;

DESCRIPTION OF THE PREFERRED EMBODIMENT

The present invention proposes a process to meet the demand for fabricating a planarized twin-wells structure wherein the N-channel and P-channel devices are built respectively. The method described here includes many process steps well known in the art like photolithography, etching or chemical vapor deposition (CVD) which are not discussed in detail. In addition, the present invention uses a process of liquid phase deposition (LPD) which has high deposition selectivity for oxide film to form the self-aligned twin-wells.

Figure 1:
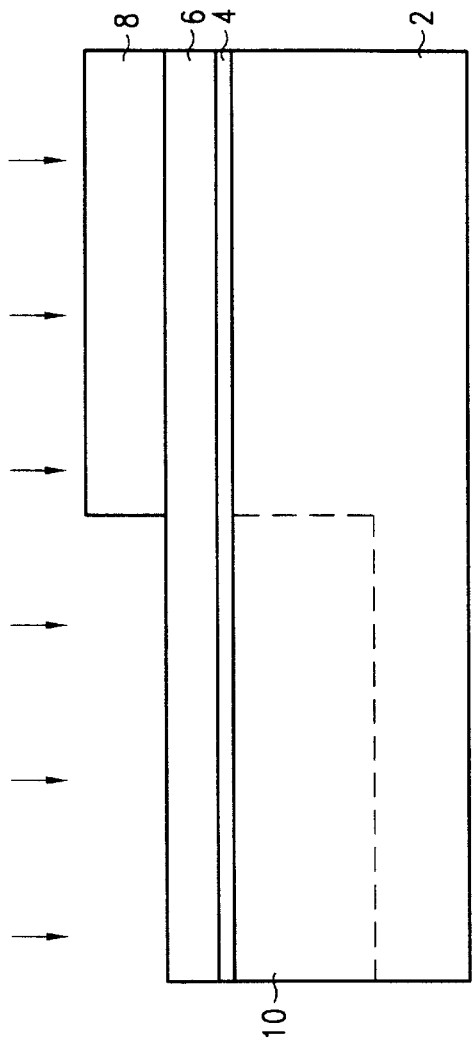
FIG. 1 is a cross-sectional view of a semiconductor wafer illustrating the step of forming a pad oxide layer, a silicon nitride layer and a patterned photoresist, and performing a high-energy phosphorus ion implantation to form the N-well on the substrate according to the present invention.

Referring to FIG. 1, a single crystal silicon substrate 2 with a <100> crystallographic orientation is provided. A silicon oxide layer 4 with the thickness about 50–200 angstroms is formed on the surface of the substrate 2 to serve as a pad oxide. This pad oxide layer 4 can be grown by using low pressure chemical vapor deposition (LPCVD) at a temperature of about 400–750° C., or using thermal oxidation at a temperature of about 800–1100° C. A silicon nitride layer 6 is then deposited, for example, using a LPCVD process at a temperature of about 700–800° C., on the silicon oxide layer 4. The thickness of the silicon nitride layer 6 is about 300–1000 angstroms. In addition to an oxidation mask as the field oxide (FOX) is formed, the silicon nitride layer 6 and the pad oxide layer 4 can be used to act as a mask to prevent the channel effect during the later ion implantation.

Next, a photoresist 8 with the pattern of N-well is formed over the silicon nitride layer 6. This N-well pattern is defined by using a standard method of photolithography including photoresist coating, exposure and development processes. The thickness of the photoresist 8 is about 0.5–3.0 μm. Thereafter, a high-energy phosphorus ion implantation indicated by the arrows shown in FIG. 1 is performed to form the N-well 10 in the portion of the substrate 2 not covered by the photoresist 8. The doping energy using by this phosphorus ion implantation is about 300–5000 keV, and the dosage is about $1\times10^{12}$–$1\times10^{14}$ atoms/cm$^2$. This energy implant the phosphorus ion into the substrate 2 through the layer consists of the silicon nitride layer 6 and the pad oxide layer 4, but not through the photoresist 8.

Figure 2:
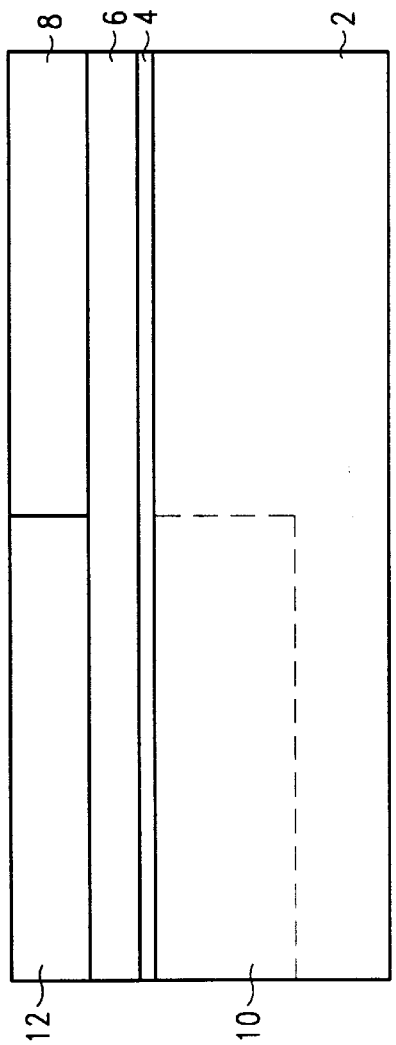
FIG. 2 is a cross-sectional view of a semiconductor wafer illustrating the step of forming a LPD-oxide layer on the N-well region part of the silicon nitride layer according to the present invention.

Turning next to FIG. 2, a thick oxide layer 12 deposited by liquid phase deposition process (LPD-oxide) is selectively grown on the N-well region part of the silicon nitride layer 6. There is no LPD-oxide grown on the photoresist 8 because of the high deposition selectivity of the LPD method. And the LPD method can be performed at room temperature without damage to the photoresist. The process of growing a self-aligned LPD-oxide is suggested by Ching-Fa Yeh, et al., in "The Physicochemical Properties and Growth Mechanism of Oxide ($SiO_{2-x}F_x$) by Liquid Phase Deposition with $H_2O$ Addition Only", J. Electrochem. Soc., Vol. 141, No. 11, pp. 3177–3181, 1994. This LPD-oxide layer 12 is used to serve as a mask in the following implantation step, and its thickness is about 0.5–2.0 μm. After stripping the photoresist 8, a high energy boron ion implantation is carried out to form P-well 14 in the portion of the substrate 2 not covered by the LPD-oxide layer 12, as shown in FIG. 3, wherein the arrows indicate the implanting direction. The doping energy using by this boron ion implantation is about 200–3000 keV, and the dosage is about $1\times10^{12}$–$1\times10^{14}$ atoms/cm$^2$. This energy implant the boron ion into the substrate 2 through the layer consists of the silicon nitride layer 6 and the pad oxide layer 4, but not through the LPD-oxide layer 8. After the P-well 14 is formed, a thermal process may be selectively performed to drive in the implanted ions.

Referring to FIG. 4, the thick LPD-oxide layer 12 is removed by using buffered oxide-etching (BOE) solution or diluted solution of hydrofluoric acid (HF) as the etchant. A photoresist 16 is formed to define the active region over the silicon nitride layer 6 by using a well-known photolithography process. An anisotropic etching is then performed to etch the silicon nitride layer 6 and the pad oxide layer 4 using the photoresist 16 as a mask. The patterned silicon nitride layer 6 and the pad oxide layer 4 are used as a mask to prevent the active region of the substrate 2 from being trenched in the following trenching step.

Thereafter, a dry etching using $Cl_2$, $BCl_3$, HBr, $SF_6$ or $SiCl_4$ as the plasma source is carried out. At this anisotropic etching step, the exposed portion of the semiconductor substrate 2 is recessed to form the trenched regions 18 with a depth deep enough for isolation. The trenched regions 18 shown in FIG. 5 are then filled with another liquid phase deposited oxide (LPD-oxide) 20 to form trench isolation regions. With the method of liquid phase deposition, there will be no LPD-oxide deposited on the regions above the photoresist 16 as shown in FIG. 6. Before the deposition of the LPD-oxide 20, a trench liner of oxide or oxynitride can be selectively formed on the sidewall and bottom surface of the trenched regions 18 by a thermal process in $O_2$, NO or $N_2O$ environment.

Figure 7:
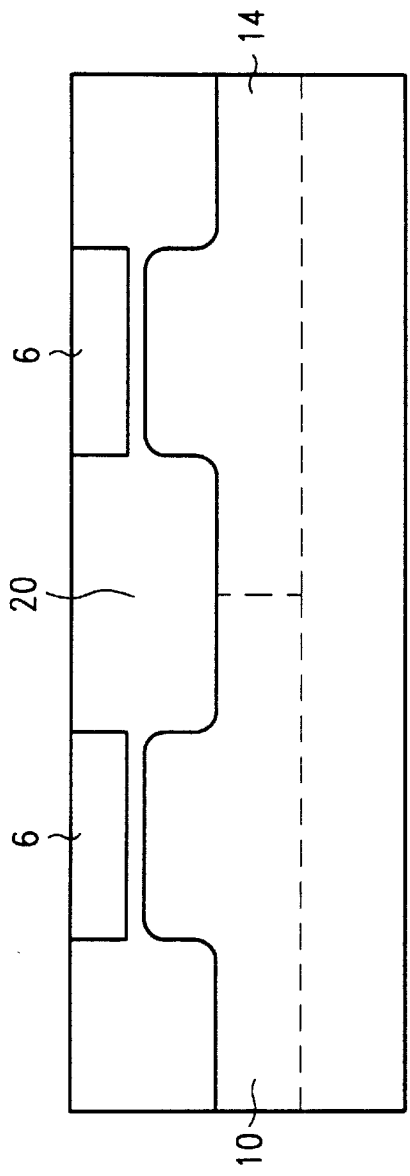
FIG. 7 is a cross-sectional view of a semiconductor wafer illustrating the step of performing a high temperature re-oxidation process to round the trench corners according to the present invention.

Next, after the photoresist 16 is removed and wet cleaned, a high temperature re-oxidation process is carried out in a dry oxygen environment. The temperature of the preferred embodiment of the re-oxidation process is at the range more than 1000° C., preferably at about 1100° C. As indicated by C. P. Chang et al. in their paper "A Highly Manufacturable Corner Rounding Solution for 0.18 μm Shallow Trench Isolation" in IEDM Tech. Dig., p. 661, 1997, mini-LOCOS edges are formed at the top trench corners (referring to the present FIG. 7 and their FIG. 5). The mini-LOCOS edges can effectively round the top trench corners. The corner effect such as current leakage can thus be solved. In addition, the substrate 2 is annealed simultaneously at this step, and the dopants are activated and driven in to form the best distribution profile. The twin-wells structure in the substrate 2 is thus formed.

Figure 8:
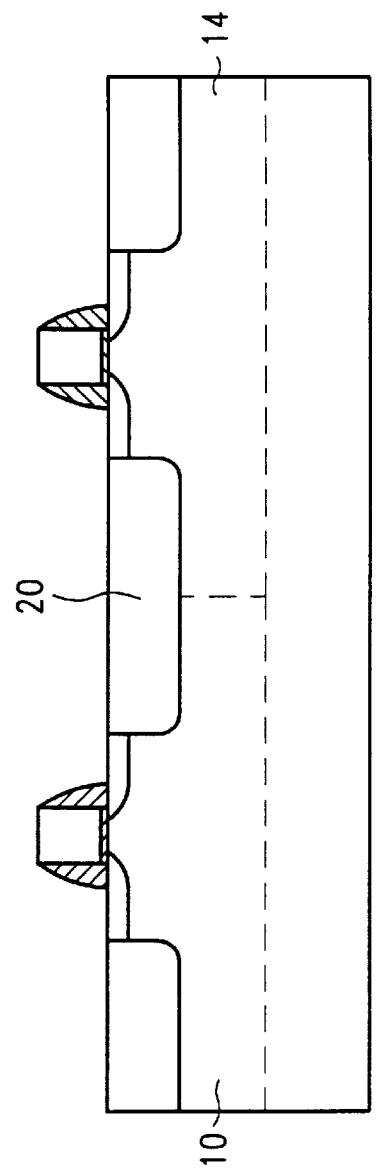
FIG. 8 is a cross-sectional view of a semiconductor wafer illustrating the step of removing the pad oxide layer and silicon nitride layer and forming the gate, source and drain on the active region to finish the fabrication of the CMOS transistor.

Finally, referring to FIG. 8, the silicon nitride layer 6 and the pad oxide layer 4 are removed to expose the active region in the substrate 2 by using a suitable etching method. For example, the method using hot solution of phosphoric acid ($H_3PO_4$) as the etchant to etch the silicon nitride layer 6 and using diluted HF solution as the etchant to etch the pad oxide layer 4 is preferable. The portion of LPD-oxide 20 which exceeds the trench regions in the semiconductor substrate can also removed, by the above wet etching using diluted HF solution as the etchant, or using CMP. Thereafter, the gate, source and drain are formed on the active region to finish the fabrication of the CMOS transistor.

By using the method mentioned above, the twin-wells are formed with a near planar surface. The sequence of the ion-implanting steps of the N-type ions and of the P-type ions can be reversed, that is, implanting the P-type ions first and then implanting the N-type ions, without departing from the spirit of the present invention. Furthermore, the twin-wells structure is achieved self-aligned using only one photoresist mask.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A process for forming planarized twin wells, said process comprising:

forming a pad oxide layer on a semiconductor substrate;

forming a silicon nitride layer on said pad oxide layer;

patterning a photoresist on a portion of said silicon nitride layer, said patterned photoresist defining a first conductive well region;

implanting ions of first type into said semiconductor substrate to form a first conductive well using said patterned photoresist as a mask;

depositing a LPD-oxide layer on said silicon nitride layer in the regions not cover by said patterned photoresist, said LPD-oxide layer being formed by a liquid phase deposition process;

removing said patterned photoresist;

implanting ions of second type into said semiconductor substrate to form second conductive well using said LPD-oxide layer as a mask;

removing said LPD-oxide layer;

etching said silicon nitride layer and said pad oxide layer to define active regions on said semiconductor substrate; and forming trenched isolation regions in said semiconductor substrate between said active regions.

2. The process according to claim 1, wherein said semiconductor substrate is a p-type substrate.

3. The process according to claim 1, wherein said semiconductor substrate is an n-type substrate.

4. The process according to claim 1, wherein said first conductive well is an N-well, and said second conductive well is a P-well.

5. The process according to claim 1, wherein said first conductive well is a P-well, and said second conductive well is an N-well.

6. The process according to claim 1, wherein a thickness of said pad oxide layer is about 50–200 angstroms.

7. The process according to claim 1, wherein a thickness of said silicon nitride layer is about 300–1000 angstroms.

8. The process according to claim 1, wherein a thickness of said photoresist is about 0.5–3.0 $\mu$m.

9. The process according to claim 1, wherein said ions of first type are phosphorus ions.

10. The process according to claim 9, wherein said phosphorus ions are implanted at about 300–5000 keV with dosage of about $1 \times 10^{12}$–$1 \times 10^{14}$ atoms/cm$^2$.

11. The process according to claim 1, wherein a thickness of said LPD-oxide layer is about 0.5–2.0 $\mu$m.

12. The process according to claim 1, wherein said ions of second type are boron ions.

13. The process according to claim 12, wherein said boron ions are implanted at about 200–3000 keV with dosage of about $1 \times 10^{12}$–$1 \times 10^{14}$ atoms/cm$^2$.

14. The process according to claim 1, wherein said LPD-oxide layer is removed by buffered oxide-etching (BOE) solution or diluted solution of hydrofluoric acid (HF).

15. The process according to claim 1, wherein said silicon nitride layer and said pad oxide layer is etched by using a second photoresist as an etching mask.

16. The process according to claim 15, wherein said trenched isolation regions are formed by the following steps:

recessing said semiconductor substrate to form trench regions by using said second photoresist, said silicon nitride layer and said pad oxide layer as an etching mask; and depositing a silicon oxide layer on said semiconductor substrate.

17. The process according to claim 16, wherein said silicon oxide layer is formed by a liquid phase deposition process.

18. The process according to claim 16 further comprising a re-oxidation process after said silicon oxide layer is deposited.

19. The process according to claim 18, wherein said re-oxidation process is performed at a temperature more than 1000° C.

20. The process according to claim 18, wherein said re-oxidation process is performed in a dry oxygen environment.

* * * * *